(12) United States Patent
Lin et al.

(10) Patent No.: US 12,198,942 B2
(45) Date of Patent: Jan. 14, 2025

(54) PACKAGING STRUCTURE AND METHOD FOR PREPARING SAME

(71) Applicant: SJ SEMICONDUCTOR (JIANGYIN) CORPORATION, Jiangyin (CN)

(72) Inventors: Jangshen Lin, Jiangyin (CN); Chengchung Lin, Jiangyin (CN); Yenheng Chen, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 616 days.

(21) Appl. No.: 17/478,806

(22) Filed: Sep. 17, 2021

(65) Prior Publication Data

US 2022/0093415 A1 Mar. 24, 2022

(30) Foreign Application Priority Data

Sep. 18, 2020 (CN) .......................... 202010989133.1
Sep. 18, 2020 (CN) .......................... 202022055491.3

(51) Int. Cl.

| | |
|---|---|
| *H01L 21/48* | (2006.01) |
| *H01L 23/00* | (2006.01) |
| *H01L 23/15* | (2006.01) |
| *H01L 23/34* | (2006.01) |
| *H01L 23/48* | (2006.01) |
| *H01L 23/498* | (2006.01) |
| *H01L 25/065* | (2023.01) |

(52) U.S. Cl.
CPC ........ *H01L 21/486* (2013.01); *H01L 21/4853* (2013.01); *H01L 23/15* (2013.01); *H01L 23/34* (2013.01); *H01L 23/481* (2013.01); *H01L 23/49816* (2013.01); *H01L 24/73* (2013.01); *H01L 24/80* (2013.01); *H01L 25/0655* (2013.01); *H01L 2224/73104* (2013.01); *H01L 2224/81192* (2013.01); *H01L 2224/92125* (2013.01)

(58) Field of Classification Search
None
See application file for complete search history.

(56) References Cited

FOREIGN PATENT DOCUMENTS

CN 212434602 U * 1/2021

* cited by examiner

*Primary Examiner* — Telly D Green
(74) *Attorney, Agent, or Firm* — IPRTOP LLC (57) ABSTRACT

The present disclosure provides a chip packaging structure and a method for preparing the same. The packaging structure includes a glass substrate, metal connecting posts, a first packaging layer, a connection layer, semiconductor chips, a filler layer, a second packaging layer, a controlled collapse chip connection (C4) layer, a base substrate, and a heat sink housing. In the present disclosure, metal connecting posts are pre-formed in a glass substrate, so that the glass substrate serves as an intermediate conduction layer, and the semiconductor chips and the C4 layer are respectively formed at opposite ends of the metal connecting posts to perform electrical connections, so that the number of process steps for preparing the packaging structure is minimized and the manufacturing cost is reduced.

10 Claims, 5 Drawing Sheets

# PACKAGING STRUCTURE AND METHOD FOR PREPARING SAME

CROSS REFERENCE TO RELATED APPLICATION

The present application claims the benefit of priority to Chinese Patent Application No. CN 2020109891331, entitled "PACKAGING STRUCTURE AND METHOD FOR PREPARING SAME", and Chinese Patent Application No. CN 2020220554913, entitled "PACKAGING STRUCTURE", both filed with CNIPA on Sep. 18, 2020, the disclosures of which are incorporated herein by reference in their entirety for all purposes.

FIELD OF TECHNOLOGY

The present disclosure generally relates to semiconductor chip packaging technology, in particular, to a packaging structure and a method for preparing the same.

BACKGROUND

Following the Moore's law, the number of transistors on an IC chip has been doubled every 18 to 24 months, although the price of computers has been halved at the same time.

Currently, front end processes of integrated circuit technologies are approaching the end of the Moore's Law, with lithography technology nearly reaching the physical limit of exposure, these technologies have been driving up the investment cost. However, back-end processes like chip packaging might open up more possibilities for the industry. Back-end packaging technologies can be roughly divided into three categories based on line spaces at the end processes, including a line width/line space (L/S) larger than 10 μm at a substrate-level, a L/S larger than 2 μm at a wafer-level (such as fan-out wafer-level package (FOWLP)), and a L/S smaller than 2 μm at a foundry-level.

In the System-on-Chip (SOC) technology, often chips with different functions prepared by front-end processes are mounted to a through-silicon-via (TSV) interposer, and these chips are connected to a substrate through the TSV interposer to form a System-in-Package (SIP) 2.5DIC packaging structure. However, in existing 2.5DIC (2.5 dimensional IC) packaging structures, the TSV Interposer is used as an intermediate connector, resulting in a high packaging cost.

Therefore, it is necessary to provide a more economical packaging structure and a method for preparing the same.

SUMMARY

The present disclosure provides a method for preparing a packaging structure, including the following steps:
providing a substrate, the substrate having recesses and comprising glass;
forming metal connecting posts in the recesses, the metal connecting posts each including a first end in contact with the glass substrate and a second end opposite to the first end;
packaging the recesses and the metal connecting posts with a first packaging layer, the second ends of the metal connecting posts are arranged to be exposed from the first packaging layer;
forming a connection layer on the glass substrate, the connection layer including metal bumps electrically connected to the metal connecting posts and a dielectric layer covering the first packaging layer and the glass substrate outside the recesses;
providing semiconductor chips, the semiconductor chips being disposed on the connection layer, front sides of the semiconductor chips being electrically connected to the metal bumps via chip pads, and back sides of the semiconductor chips facing away from the glass substrate;
filling a gap between the semiconductor chips and the connection layer with a filler layer to enclose the front sides of the semiconductor chips and the metal bumps;
encapsulating the connection layer and semiconductor chips with a encapsulation layer;
removing a portion of the glass substrate and the first packaging layer to expose the first ends of the metal connecting posts;
forming a controlled collapse chip connection (C4) layer, the C4 layer including a wiring layer and second solder bumps, the wiring layer being electrically connected to the metal connecting posts;
thinning the second packaging layer to expose the back sides of the semiconductor chips to form a package body;
providing a base substrate, the package body being electrically connected to the base substrate through the second solder bumps in the C4 layer; and
providing a heat sink housing, the heat sink housing being disposed on the base substrate and enclosing the package body, the bottom of the heat sink housing being in contact with the package body.

Optionally, the height of the metal connecting posts is greater than the depth of the recesses.

Optionally, the first packaging layer covers the glass substrate, and the second ends of the metal connecting posts are exposed by grinding.

Optionally, the method further includes a step of forming a third packaging layer between the C4 layer and the base substrate.

The present disclosure also provides a chip packaging structure, including:
a substrate provided with recesses running therethrough, the substrate may contain glass material;
metal connecting posts disposed in the recesses, the metal connecting posts each including a first end and an opposite second end;
a first packaging layer filling the recesses and surrounding the metal connecting posts, the first ends and the second ends of the metal connecting posts being configured to expose from both upper and bottom surfaces of the first packaging layer;
a connection layer disposed on the glass substrate, the connection layer including metal bumps each electrically connected to one of the second ends of the metal connecting posts and a dielectric layer covering the first packaging layer and the glass substrate;
semiconductor chips located on the connection layer, front sides of the semiconductor chips being electrically connected to the metal bumps via chip pads, and back sides of the semiconductor chips facing away from the glass substrate;
a filler layer filling a gap between the semiconductor chips and the connection layer to enclose the front sides of the semiconductor chips and the metal bumps;
a second packaging layer packaging the connection layer and semiconductor chips and exposing the back sides of the semiconductor chips;

a C4 layer including a wiring layer and first solder bumps, the wiring layer being electrically connected to the metal connecting posts to form a package body;

a base substrate, the package body being electrically connected to the base substrate through the first solder bumps; and a heat sink housing located on the base substrate and enclosing the package body, the bottom of the heat sink housing being in contact with the package body.

Optionally, the metal connecting posts include one or more of Au metal connecting posts, Ag metal connecting posts, Cu metal connecting posts, and Al metal connecting posts.

Optionally, the first packaging layer includes one of an epoxy resin layer, a polyimide layer, and a silicone layer; and the second packaging layer includes one of an epoxy resin layer, a polyimide layer, and a silicone layer.

Optionally, the filler layer includes one of an epoxy resin layer, a polyimide layer, and a silicone layer.

Optionally, the packaging structure further includes first solder bumps electrically connected to the base substrate; and further includes a third packaging layer between the C4 layer and the base substrate.

Optionally, the first solder bumps include one of copper solder bumps, nickel solder bumps, tin solder bumps, and silver solder bumps; and the metal bumps include one of copper metal bumps, nickel metal bumps, tin metal bumps, and silver metal bumps.

As described above, in the packaging structure and the method for preparing the same of the present disclosure, the metal connecting posts are formed in the glass substrate, so that the glass substrate serves as an intermediate conduction layer, and the semiconductor chips and the C4 layer are respectively formed at opposite ends of the metal connecting posts to realize electrical connection, so that the number of process steps for preparing the packaging structure is minimized and the manufacturing cost can be reduced.

BRIEF DESCRIPTION OF THE DRAWINGS

FIGS. 2 to 14 are schematic diagrams showing intermediate structures obtained after various steps of preparing the packaging structure in the present disclosure, wherein FIG. 14 is also a schematic structural diagram of the packaging structure prepared in the present disclosure.

DETAILED DESCRIPTION

Embodiments of the present disclosure will be described below with specific examples, and other advantages and effects of the present disclosure may be easily understood by those skilled in the art from the disclosure in the specification. The present disclosure may also be carried out or applied in other different specific embodiments, and various modifications or changes may also be made to the details in the specification based on different ideas and applications without departing from the spirit of the present disclosure.

As in the detailed description of the embodiments of the present disclosure, for convenience of description, cross-sectional views illustrating device structures are generally partially enlarged not based on the general scale, and the schematic diagrams are only examples, which should not limit the scope of the present disclosure herein. In addition, length, width and depth three-dimensional space sizes should be considered in the actual fabrication.

For ease of description, spatial relationship terms such as "beneath", "below", "lower than", "under", "above", and "on" may be used herein to describe a relationship between one element or feature and other elements or features shown in the drawings. It will be appreciated that these spatial relationship terms are intended to encompass directions of a device in use or operation other than directions depicted in the drawings. In addition, when a layer is referred to as being "between" two layers, it may be the only layer between the two layers, or there may be one or more layers therebetween. The phrase "between . . . and . . . " used herein indicates that two endpoint values are included.

In the context of the present application, a structure described to have a first feature "on" a second feature may include embodiments in which the first and second features are formed in direct contact, and may also include embodiments in which an additional feature is formed between the first and second features such that the first and second features may not be in direct contact.

It is to be noted that drawings provided in the embodiments only schematically illustrate the basic idea of the present disclosure, so the drawings only show components related to the present disclosure, and are not drawn according to the numbers, shapes and sizes of the components in actual implementation; the forms, numbers and proportions of the components in actual implementation may be adjusted as needed; and the layout of the components may be more complex.

Figure 1:
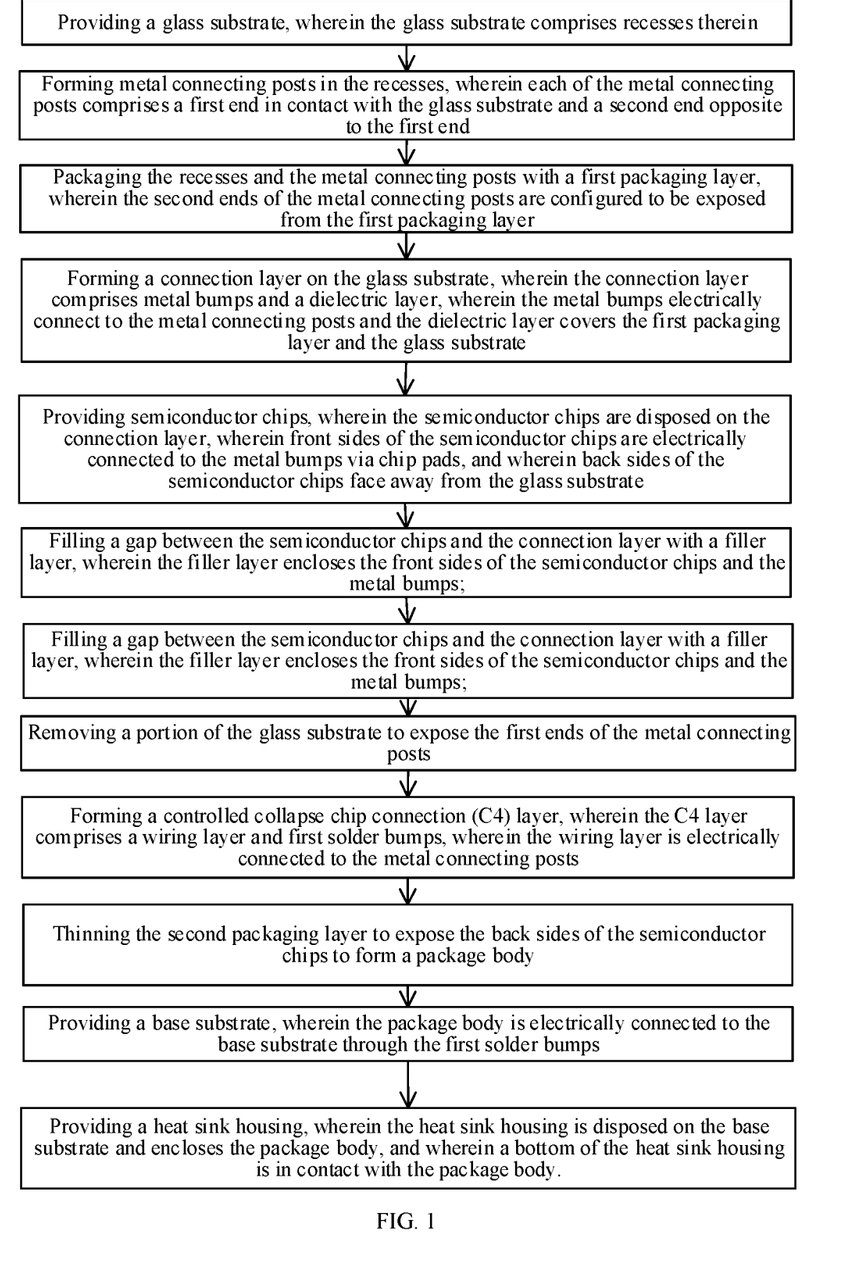
FIG. 1 shows a flow chart illustrating process steps of preparing a packaging structure in the present disclosure.
Figure 2:
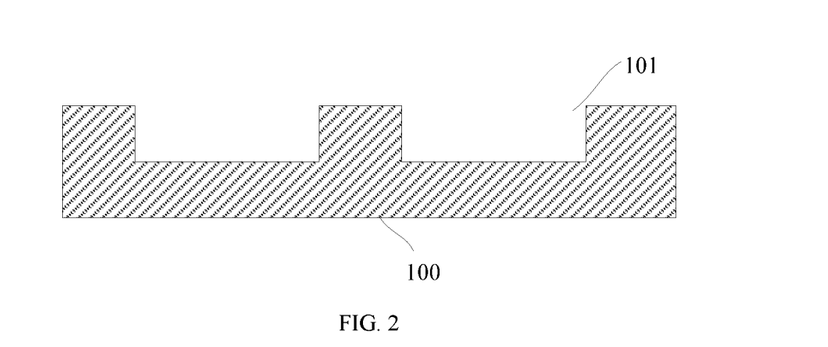

Referring to FIG. 1, the present disclosure provides a method for preparing a chip packaging structure. In one embodiment, metal connecting posts are pre-formed in a glass substrate, so that the glass substrate with them serves as an intermediate conduction layer, and semiconductor chips and a C4 layer are respectively formed at opposite ends of the metal connecting posts to realize electrical connection, so that the number of process steps for preparing the packaging structure and the manufacturing cost can be reduced. An exemplary preparation process is as follows:

First, as shown in FIG. 2, a glass substrate 100 is provided, and the glass substrate 100 has recesses 101 in it.

For example, the glass substrate 100 may be etched to form the recesses 101.

Figure 3:
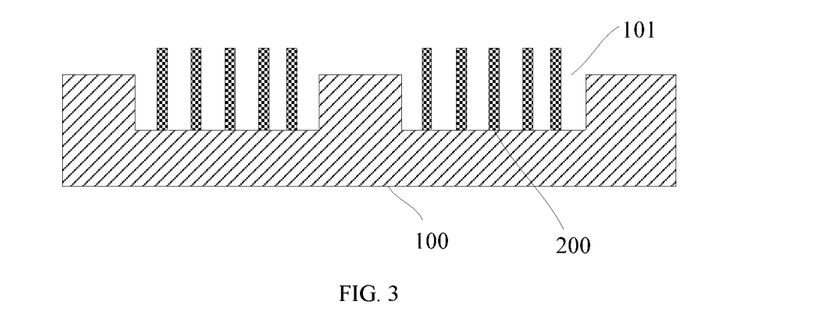

Next, referring to FIG. 3, metal connecting posts 200 are formed in the recesses 101, the metal connecting post 200 each comprising a first end in contact with the glass substrate 100 and an opposite second end.

For example, the metal connecting posts 200 include one or more of Au metal connecting posts, Ag metal connecting posts, Cu metal connecting posts and Al metal connecting posts. Cu metal connecting posts are used in one embodiment.

As an example, preferably, the height of the metal connecting posts 200 is greater than the depth of the recesses, in order to facilitate electrical connection between a subsequently formed connection layer 400 and the metal connecting posts 200.

Figure 4:
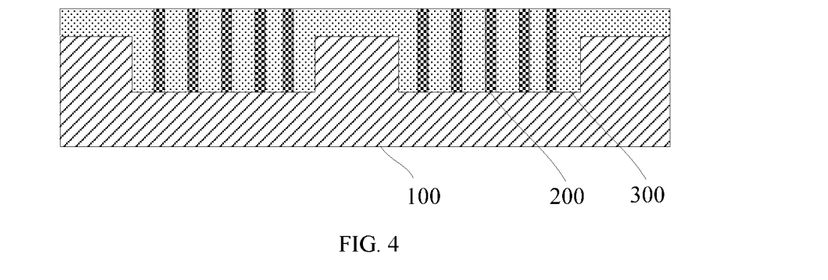
Figure 5:
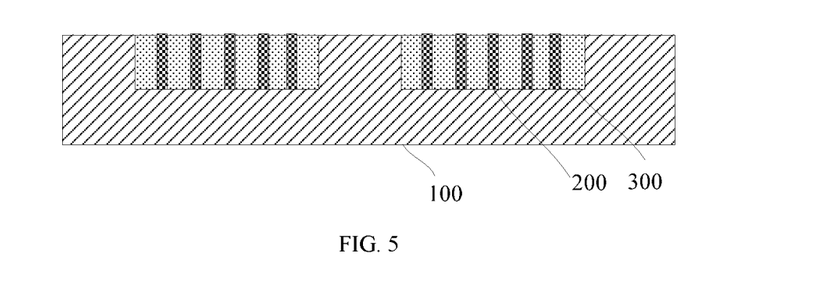

Next, referring to FIGS. 4 and 5, the recesses 101 and the metal connecting posts 200 are packaged by a first packaging layer 300, and the second ends of the metal connecting posts 200 are exposed from the first packaging layer 300.

In one embodiment, the first packaging layer 300 covers the glass substrate 100, and a grinding process (e.g., mechanical grinding or chemical-mechanical polishing (CMP)) is performed to expose the second ends of the metal connecting posts 200, so that a flat surface can be provided to facilitate subsequent formation of the connection layer 400 and improve the bonding quality.

Figure 6:
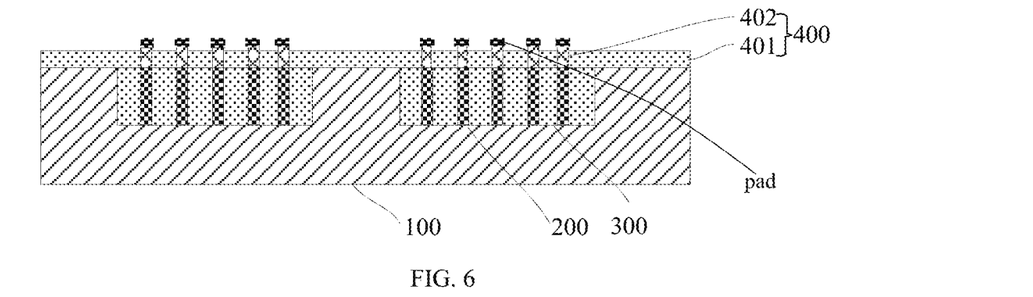

Next, referring to FIG. 6, the connection layer 400 is formed on the glass substrate 100, and the connection layer 400 includes metal bumps 402 electrically connected to the metal connecting posts 200 and a dielectric layer 401 covering the first packaging layer 300 and the glass substrate 100.

The dielectric layer 401 may include one of an epoxy resin dielectric layer, a polyimide dielectric layer, and a silicone dielectric layer, and the material of the dielectric layer 401 is not limited to these. The metal bumps 402 may include one of copper metal bumps, nickel metal bumps, tin metal bumps, and silver metal bumps, and the material of the metal bumps 402 is not limited to these.

Figure 7:
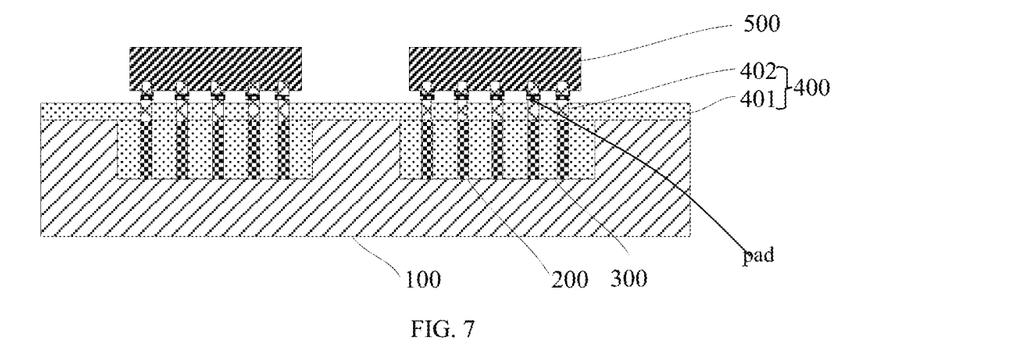

Next, referring to FIG. 7, semiconductor chips 500 are provided. The semiconductor chips 500 are located on the connection layer 400, front sides of the semiconductor chips 500 are electrically connected to the metal bumps 402 via chip pads, and back sides of the semiconductor chip 500 face away from the glass substrate 100, wherein the type and size of the semiconductor chips 500 may be selected as needed.

Figure 8:
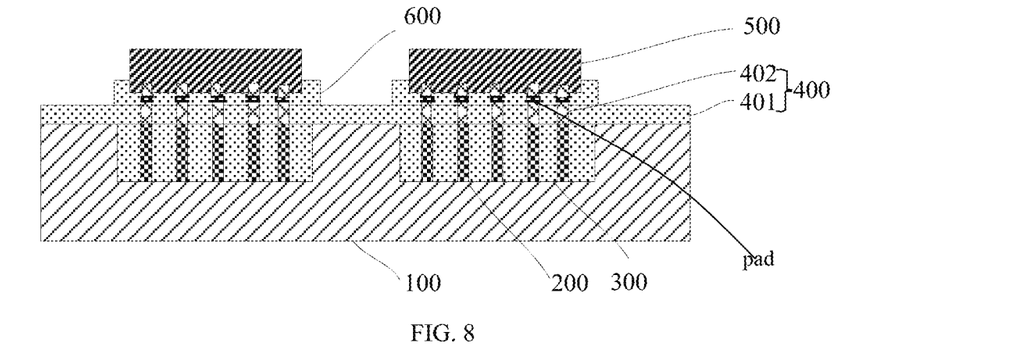

Next, referring to FIG. 8, a filler layer 600 is used to fill a gap between the semiconductor chips 500 and the connection layer 400 to enclose the front sides of the semiconductor chips 500 and the metal bumps 402.

For example, the filler layer 600 may include one of an epoxy resin layer, a polyimide layer, and a silicone layer, to avoid contamination of the chip pads of the semiconductor chips 500 and metal bumps 402 by contaminants such as water vapor, with the filler layer 600 acting as a protective layer. The filler layer 600 also improves the bonding strength between the semiconductor chips 500 and the metal bumps 402.

Figure 9:
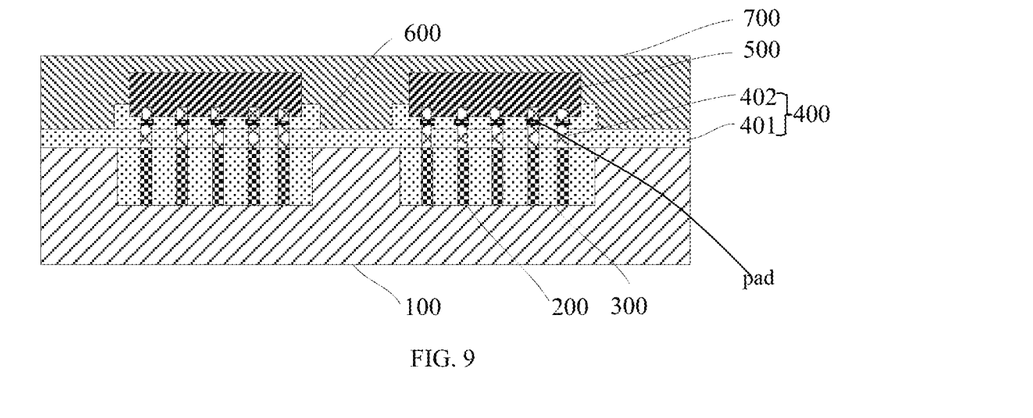

Next, referring to FIG. 9, the connection layer 400 and semiconductor chips 500 are packaged by a second packaging layer 700.

For example, the second packaging layer 700 may include one of an epoxy resin layer, a polyimide layer, and a silicone layer, and a method of forming the second packaging layer 700 may include one of compression molding, transfer molding, liquid seal molding, vacuum lamination, and spin coating. The second packaging layer 700 protects the semiconductor chips 500. To reduce the process complexity, the second packaging layer 700 may be used as a support substrate to facilitate the subsequent process of thinning the glass substrate 100 and preparing a C4 layer 800.

Figure 10:
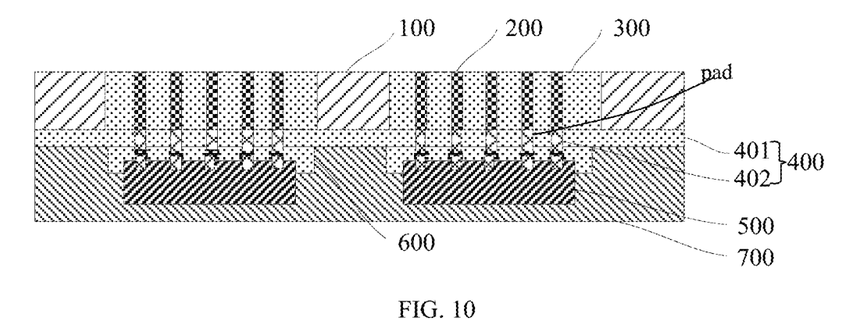

Next, referring to FIG. 10, a portion of the glass substrate 100 is removed to expose the first ends of the metal connecting posts 200, wherein the method of removing the portion of the glass substrate 100 may include one or more of mechanical grinding and CMP.

Figure 11:
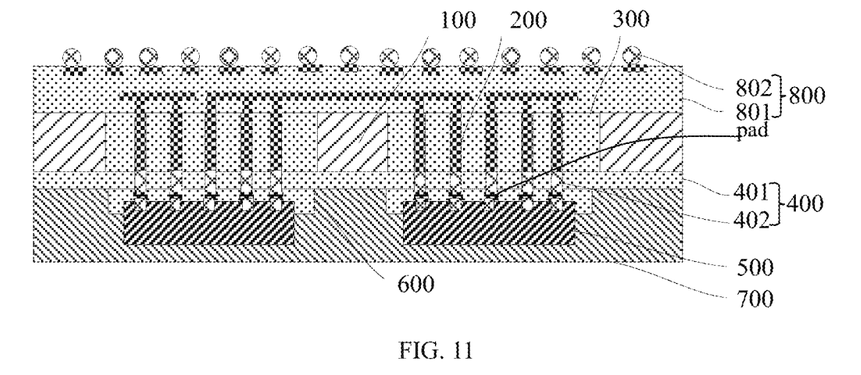

Next, referring to FIG. 11, the C4 layer 800 is formed. The C4 layer 800 includes a wiring layer 801 and first solder bumps 802, with the wiring layer 801 electrically connected to the metal connecting posts 200.

In one embodiment, the C4 layer 800 may include 1 to 5 wiring layers 801 arranged in a stacked manner, and the wiring layers 801 may include one or more of Au wiring metal, Ag wiring metal, Cu wiring metal and Al wiring metal; the first solder bumps 802 may include one of copper solder bumps, nickel solder bumps, tin solder bumps, and silver solder bumps, or alloy solder bumps prepared from an alloy formed by Cu Ni, Sn, and Ag metals.

Figure 12:
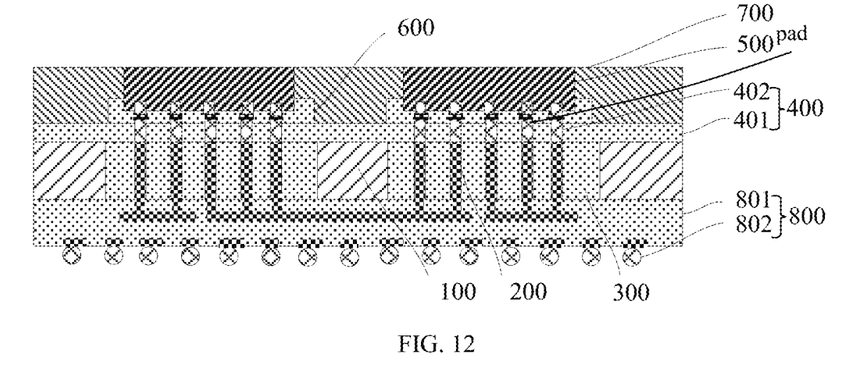

Next, referring to FIG. 12, the second packaging layer 700 is thinned to expose the back sides of the semiconductor chips 500 to form a package body.

For example, the method of thinning the second packaging layer 700 may include one or more of mechanical grinding and CMP, wherein in the process of thinning, the back sides of the semiconductor chips 500 may also be thinned depending on the type of the semiconductor chips 500.

Figure 13:
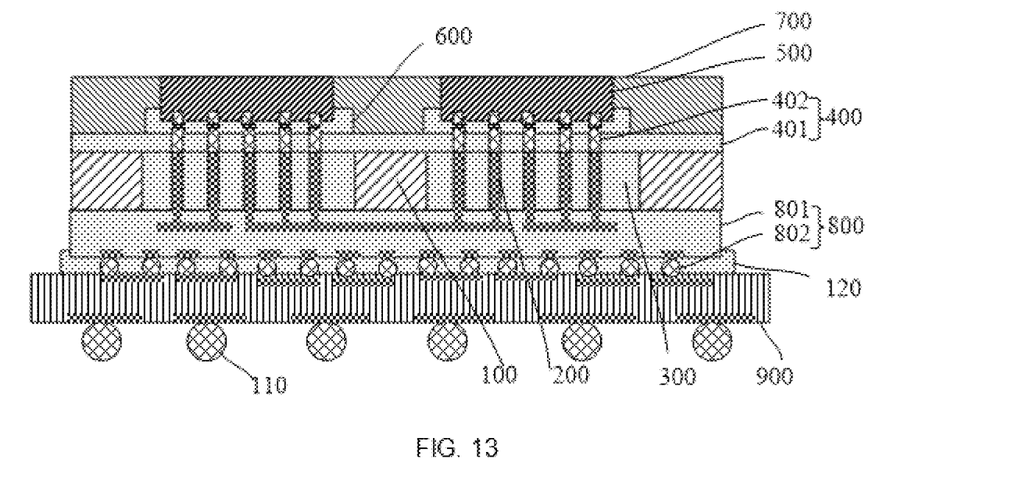

Next, referring to FIG. 13, a base substrate 900 is provided, with the package body electrically connected to the base substrate 900 through the first solder bumps 802.

In one embodiment, the base substrate 900 may include a printed circuit board (PCB), flexible printed circuit, or metal circuit board. In the present disclosure, using a PCB as an example, solder pads on the PCB are electrically connected to the first solder bumps 802 to realize electrical lead-out.

As an example, the preparation method further includes a step of forming second solder bumps 110 on the base substrate 900 to facilitate electrical lead-out through the second solder bumps 110, wherein the second solder bumps 110 may include one of copper solder bumps, nickel solder bumps, tin solder bumps, and silver solder bumps.

As an example, the preparation method further includes a step of forming a third packaging layer 120 between the C4 layer 800 and the base substrate 900. The third packaging layer 120 includes one of an epoxy resin layer, a polyimide layer, and a silicone layer, and the third packaging layer 120 improves the bonding strength between the C4 layer 800 and the base substrate 900, and protects the C4 layer 800 and the base substrate 900 from moisture and oxidation, thereby improving stability.

Figure 14:
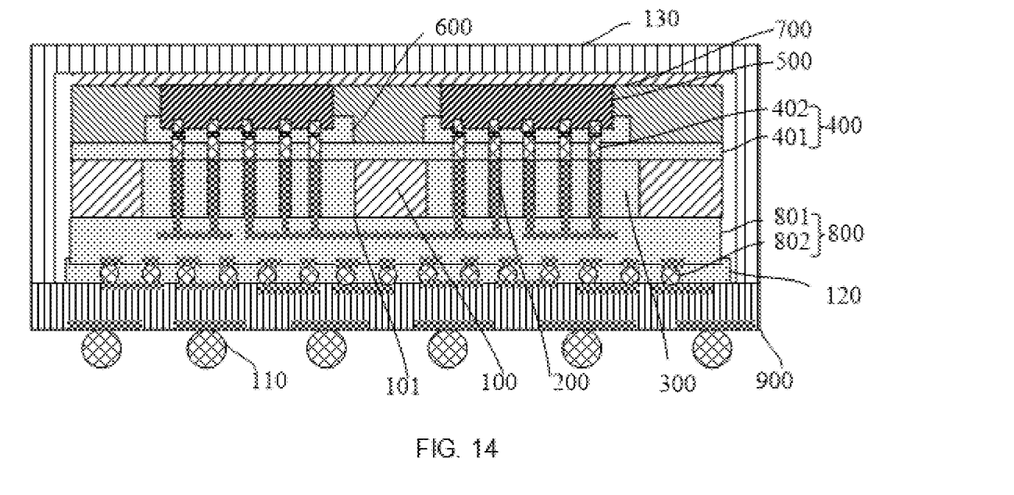

Next, referring to FIG. 14, a heat sink housing 130 is provided, the heat sink housing 130 being located on the base substrate 900 and enclosing the package body, the bottom of the heat sink housing 130 being in contact with the package body.

For example, the heat sink housing 130 may be bonded to the package body through a material with good thermal conductivity to further provide a heat dissipation effect.

As in FIG. 14, the present disclosure also provides a packaging structure. The packaging structure includes a glass substrate 100, metal connecting posts 200, a first packaging layer 300, a connection layer 400, semiconductor chips 500, a filler layer 600, a second packaging layer 700, a C4 layer 800, a base substrate 900, and a heat sink housing 130.

For example, the glass substrate 100 is provided with recesses 101 running through the glass substrate 100; the metal connecting posts 200 are located in the recesses 101, and each of the metal connecting posts 200 includes a first end and an opposite second end; the first packaging layer 300 encloses the metal connecting posts 200 and fills the recesses 101, and the first ends and the second ends of the metal connecting posts 200 are exposed by the first packaging layer 300; the connection layer 400 is located on the glass substrate 100, and the connection layer 400 includes metal bumps 402 electrically connected to the second ends of the metal connecting posts 200 and a dielectric layer 401 covering the first packaging layer 300 and the glass substrate 100; the semiconductor chips 500 are located on the connection layer 400, front sides of the semiconductor chips 500 are electrically connected to the metal bumps 200 via chip pads, and back sides of the semiconductor chips 500 face away from the glass substrate 100; the filler layer 600 fills a gap between the semiconductor chips 500 and the connection layer 400 to enclose the front sides of the semiconductor chips 500 and the metal bumps 402; the second packaging layer 700 encapsulates the connection layer 400 and semiconductor chips 500 and exposes the back sides of the semiconductor chips 500; the C4 layer 800 includes a wiring layer 801 and first solder bumps 802, and the wiring layer 801 is electrically connected to the metal connecting posts 200 to form a package body; the package body is electrically connected to the base substrate 900 through the first solder bumps 802; and the heat sink housing 130 is located on the base substrate 900 and encloses the package body, with the bottom of the heat sink housing 130 in contact with the package body.

In one embodiment, the packaging structure is prepared by the method described above, so the preparation process, materials, etc. are not repeated here.

The glass substrate 100 of the present disclosure serves as an intermediate conduction layer, and the semiconductor chips 500 and the C4 layer 800 are respectively formed at opposite ends of the metal connecting posts 200 to realize electrical connection, so that the number of process steps for preparing the packaging structure and the manufacturing cost can be reduced.

As an example, the metal connecting posts 200 include one or more of Au metal connecting posts, Ag metal connecting posts, Cu metal connecting posts, and Al metal connecting posts.

As an example, the first packaging layer 300 includes one of an epoxy resin layer, a polyimide layer, and a silicone layer; and the second packaging layer 700 includes one of an epoxy resin layer, a polyimide layer, and a silicone layer.

As an example, the filler layer 600 includes one of an epoxy resin layer, a polyimide layer, and a silicone layer.

As an example, the packaging structure further includes the second solder bumps 110 electrically connected to the base substrate 900.

As an example, the packaging structure further includes a third packaging layer 120 located between the C4 layer 800 and the base substrate 900.

As an example, the first solder bumps 802 include one of copper solder bumps, nickel solder bumps, tin solder bumps, and silver solder bumps; and the metal bumps 402 include one of copper metal bumps, nickel metal bumps, tin metal bumps, and silver metal bumps.

In summary, in the present disclosure, the metal connecting posts are pre-formed in the glass substrate, so that the glass substrate serves as an intermediate conduction layer, and the semiconductor chips and the C4 layer are respectively formed at opposite ends of the metal connecting posts to realize electrical connection, so that the number of process steps for preparing the packaging structure and the manufacturing cost can be reduced.

The above embodiments are merely illustrative of the principles of the present disclosure and effects thereof, and are not intended to limit the present disclosure. Any person skilled in the art can modify or change the above embodiments without departing from the spirit and scope of the present disclosure. Therefore, all equivalent modifications or changes made by those with general knowledge in the technical field without departing from the spirit and technical ideas disclosed in the present disclosure are still covered by the claims of the present disclosure.

What is claimed is:

1. A method for preparing a chip packaging structure, comprising:
   providing a glass substrate, wherein the glass substrate comprises recesses therein;
   forming metal connecting posts in the recesses, wherein each of the metal connecting posts comprises a first end in contact with the glass substrate and a second end opposite to the first end;
   packaging the recesses and the metal connecting posts with a first packaging layer, wherein the second ends of the metal connecting posts are configured to be exposed from the first packaging layer;
   forming a connection layer on the glass substrate, wherein the connection layer comprises metal bumps and a dielectric layer, wherein the metal bumps electrically connect to the metal connecting posts and the dielectric layer covers the first packaging layer and the glass substrate;
   providing semiconductor chips, wherein the semiconductor chips are disposed on the connection layer, wherein front sides of the semiconductor chips are electrically connected to the metal bumps via chip pads, and wherein back sides of the semiconductor chips face away from the glass substrate;
   filling a gap between the semiconductor chips and the connection layer with a filler layer, wherein the filler layer encloses the front sides of the semiconductor chips and the metal bumps;
   packaging the connection layer and semiconductor chips with a second packaging layer;
   removing a portion of the glass substrate to expose the first ends of the metal connecting posts;
   forming a controlled collapse chip connection (C4) layer, wherein the C4 layer comprises a wiring layer and first solder bumps, wherein the wiring layer is electrically connected to the metal connecting posts;
   thinning the second packaging layer to expose the back sides of the semiconductor chips to form a package body;
   providing a base substrate, wherein the package body is electrically connected to the base substrate through the first solder bumps; and
   providing a heat sink housing, wherein the heat sink housing is disposed on the base substrate and encloses the package body, and wherein a bottom of the heat sink housing is in contact with the package body.

2. The method according to claim 1, wherein a height of one of the metal connecting posts is greater than a depth of one of the recesses.

3. The method according to claim 1, wherein the first packaging layer covers the glass substrate, and wherein the second ends of the metal connecting posts are exposed out of the first packaging layer by an grinding process.

4. The method according to claim 1, further comprising a step of forming a third packaging layer between the C4 layer and the base substrate.

5. A packaging structure, comprising:
   a glass substrate provided with recesses running therethrough;
   metal connecting posts fabricated in the recesses, wherein each of the metal connecting posts comprises a first end and a second end opposite to the first end;
   a first packaging layer, wherein the first packaging layer fills the recesses and encloses the metal connecting posts, wherein the first ends and the second ends of the metal connecting posts are both configured to be exposed from upper and lower surfaces of the first packaging layer;
   a connection layer located on the glass substrate, wherein the connection layer comprises metal bumps and a dielectric layer, wherein the metal bumps are electrically connected to the second ends of the metal connecting posts and the dielectric layer covers the first packaging layer and the glass substrate;
   semiconductor chips disposed on the connection layer, wherein front sides of the semiconductor chips are electrically connected to the metal bumps via chip pads, and wherein back sides of the semiconductor chips face away from the glass substrate;

a filler layer filling a gap between the semiconductor chips and the connection layer to enclose the front sides of the semiconductor chips and the metal bumps;

a second packaging layer packaging the connection layer and the semiconductor chips, wherein the second packaging layer exposes the back sides of the semiconductor chips;

a C4 layer comprising a wiring layer and first solder bumps, wherein the wiring layer is electrically connected to the metal connecting posts to form a package body;

a base substrate, wherein the package body is electrically connected to the base substrate through the first solder bumps; and a heat sink housing placed on the base substrate and enclosing the package body, wherein a bottom of the heat sink housing is in contact with the package body.

6. The packaging structure according to claim 5, wherein the metal connecting posts comprise one or more of Au metal connecting posts, Ag metal connecting posts, Cu metal connecting posts, and Al metal connecting posts.

7. The packaging structure according to claim 5, wherein the first packaging layer comprises one of an epoxy resin layer, a polyimide layer, and a silicone layer, and the second packaging layer comprises one of an epoxy resin layer, a polyimide layer, and a silicone layer.

8. The packaging structure according to claim 5, wherein the filler layer comprises one of an epoxy resin layer, a polyimide layer, and a silicone layer.

9. The packaging structure according to claim 5, further comprising, second solder bumps electrically connected to the base substrate; and a third packaging layer disposed between the C4 layer and the base substrate.

10. The packaging structure according to claim 5, wherein the first solder bumps comprise one of copper solder bumps, nickel solder bumps, tin solder bumps, and silver solder bumps, and the metal bumps comprise one of copper metal bumps, nickel metal bumps, tin metal bumps, and silver metal bumps.

* * * * *